(12) United States Patent
Bernard

(10) Patent No.: US 8,859,945 B2
(45) Date of Patent: Oct. 14, 2014

(54) DATA PROCESSING CIRCUIT WITH AN ELEMENTARY PROCESSOR, DATA PROCESSING ASSEMBLY INCLUDING AN ARRAY OF SUCH CIRCUITS, AND MATRIX SENSOR INCLUDING SUCH AN ASSEMBLY

(75) Inventor: Thierry Bernard, Verrieres le Bulsson (FR)

(73) Assignee: Commissariat à l'Energie Atomique et aux Energies Alternatives (FR)

(*) Notice: Subject to any disclaimer, the term of this patent is extended or adjusted under 35 U.S.C. 154(b) by 935 days.

(21) Appl. No.: 13/055,078

(22) PCT Filed: Jul. 23, 2009

(86) PCT No.: PCT/EP2009/059503
§ 371 (c)(1),
(2), (4) Date: Apr. 18, 2011

(87) PCT Pub. No.: WO2010/010151
PCT Pub. Date: Jan. 28, 2010

(65) Prior Publication Data
US 2011/0180691 A1    Jul. 28, 2011

(30) Foreign Application Priority Data

Jul. 23, 2008    (FR) ..................... 08 55014

(51) Int. Cl.
*G01J 1/42*    (2006.01)
*G11C 19/38*    (2006.01)
*H04N 5/378*    (2011.01)
*G11C 19/18*    (2006.01)
*G06T 1/00*    (2006.01)
*H04N 5/335*    (2011.01)

(52) U.S. Cl.
CPC ............. *G11C 19/38* (2013.01); *H04N 5/378* (2013.01); *G11C 19/184* (2013.01); *G06T 1/0007* (2013.01); *H04N 5/335* (2013.01)
USPC ........................ 250/208.2; 365/149

(58) Field of Classification Search
USPC ............. 250/208.2; 365/94, 191, 230.3; 369/59.14–59.22
See application file for complete search history.

(56) References Cited

U.S. PATENT DOCUMENTS

| 4,943,786 A * | 7/1990 | Cordwell et al. ............ 331/1 A |
| 6,708,238 B1 * | 3/2004 | Rotker ............................ 710/58 |
| 2002/0075532 A1 * | 6/2002 | Shiraishi ...................... 358/539 |
| 2005/0058048 A1 * | 3/2005 | Park et al. ................... 369/59.17 |

FOREIGN PATENT DOCUMENTS

| FR | 2583602 A1 | 12/1986 |
| FR | 2683348 A1 | 5/1993 |
| JP | 07-028988 A | 1/1995 |

OTHER PUBLICATIONS

International Search Report, PCT/EP2009/059503, dated Oct. 29, 2009.
Paillet F et al: "Low power issues in-a digital progralmlable artificial retina" Low-Power Design, 1999. Proceedings.—IEEE Alessandro Volta Memorial Workshop On-Como, Italy Mar. 4-5, 1999,Los. Alamitos,CA, USA,IEEE Comput. Soc, US, Mar. 4, 1999,. pp. 153-161, XPOI0323916.

* cited by examiner

*Primary Examiner* — Seung C Sohn
(74) *Attorney, Agent, or Firm* — Lerner, David, Littenberg, Krumholz & Mentlik, LLP

(57) ABSTRACT

A data processing circuit includes a data processing unit including two signal-conversion circuits and controlled switches connected to inputs and outputs of the conversion circuits. The data processing unit further includes a binary signal inlet, a binary signal outlet, and a memory unit. The memory unit includes capacitors each storing a binary piece of data. The capacitors are connected to a memory bus via switches. The bus is connected to the processing unit. In response to control signals provided to the controlled switches, the data processing unit performs at least the following operations: writing a binary datum in a capacitor, reading from a capacitor a binary datum stored therein and applying the datum to an output, and logically combining binary data stored in at least two capacitors.

24 Claims, 4 Drawing Sheets

Figure 1:
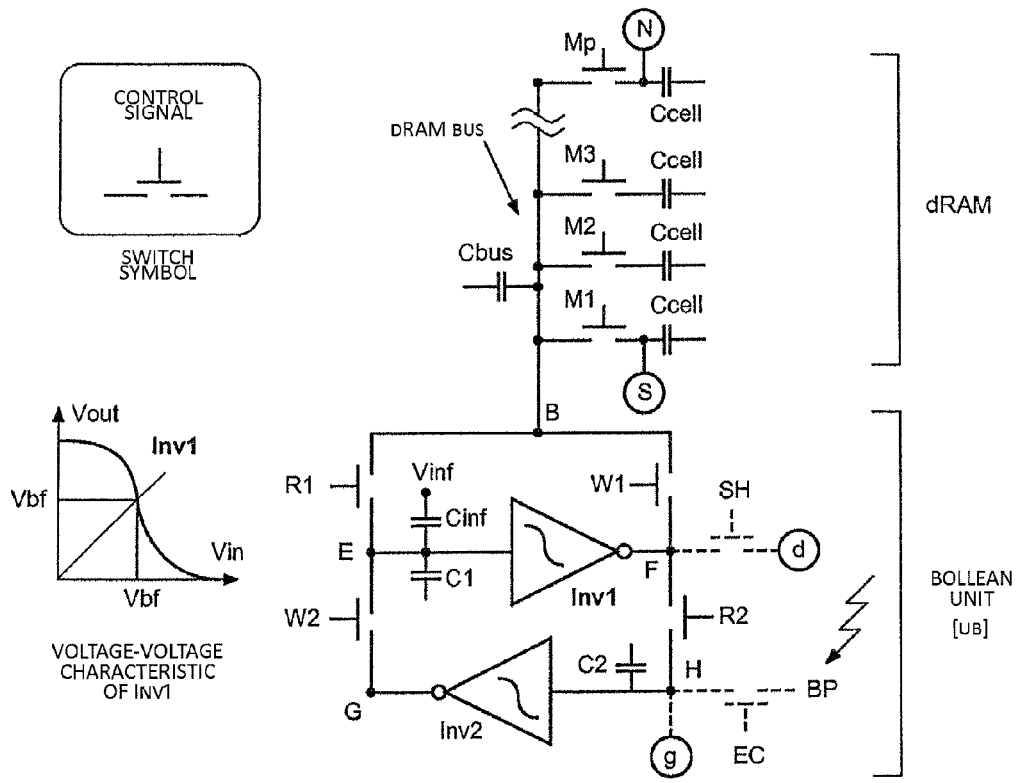

DATA PROCESSING CIRCUIT WITH AN ELEMENTARY PROCESSOR, DATA PROCESSING ASSEMBLY INCLUDING AN ARRAY OF SUCH CIRCUITS, AND MATRIX SENSOR INCLUDING SUCH AN ASSEMBLY

CROSS-REFERENCE TO RELATED APPLICATIONS

The present application is a national phase entry under 35 U.S.C. §371 of International Application No. PCT/EP2009/059503 filed Jul. 23, 2009, published in French, which claims priority from French Appl. No. 0855014 filed Jul. 23, 2008, all of which are incorporated herein by reference.

The invention relates in general to the data processing circuits of an assembly of data sources such as a matrix sensor.

The invention also relates to a matrix sensor comprising a set of detection cells forming the data sources and equipped with a plurality of such processing circuits.

In one particular application, the invention concerns the data processing of detection cells such as photo-sensitive cells for artificial vision, wherein the sensor forms an artificial retina.

The purpose of the artificial vision techniques are to determine certain actual characteristics of a scene observed, from sequences of images of this scene which are provided by a camera, in order to carry out, in a time that may be short or long, actions related to said scene.

For several years, many models of cameras are digital. Whereas the image sensors naturally supply analogue data, these digital cameras supply directly digital images as they incorporate analogue-digital conversion means. Currently, a normal system of artificial vision typically comprises a digital camera and resources to process the information digitally, which may range from a simple desktop computer to specialised calculators or super-calculators.

These different configurations depend on the complexity of the vision tasks to be accomplished, which involve algorithms that require calculations of varying complexity to be carried out on the data.

The energy consumption of a normal vision system may thus range from a dozen to several hundred Watts according to the solution retained. It may be understood that such power levels consumed are most often incompatible for mobile use, or static but wireless use (especially when it is too costly to connect an electrical power supply).

A first example may be cited in the field of surveillance. Indeed, it is not possible today to conceive an intelligent camera which operates with a few everyday batteries that is capable to observe a site for several weeks and to detect and characterise the movements of persons or vehicles.

A second example may be found in video-telephony, or video-conferencing. Indeed, it would be easier to transmit between mobile telephones an animated model of the faces of the users than a compressed video sequence, as is common practice today. However the generation of such an animated model for a telephone requires an analysis of the successive images that is not really compatible with its autonomy in power.

A third example relates to a mobile robot or vehicle with a degree of automation, where the artificial vision, based on images captured in the visible or infrared spectra, has to play an important role in the assisted or automatic driving of it, or even in the gripping of objects.

In this example, even if part of the propelling energy of a vehicle may be used for the vision functions, like on a car, the expected multiplication of the number of visual sensors demands a certain restraint in the power used. This restraint is even more critical on a compact vehicle or robot, and further still on flying craft such as a drone.

We have therefore sought to propose vision systems that are very energy conscious.

To this end, known architecture consists of implementing an elementary processor (hereafter designated by PE) that is designed to be repeated on each node according to a bidimensional array in an integrated circuit.

This bidimensional array corresponds either to the image, with one PE per pixel, or to a low-resolution version of the image, with one PE for a small group of pixels called macro-pixel, for example a block of 2×2 or 4×4 pixels. The PEs are piloted by control signals which may be common to all of the PEs (SIMD or Single Instruction Multiple Data) or common to sub-families of PEs, especially according to the patent FR-A-2 778 764 (Bernard, Paillet and Mercier). Furthermore, each PE is capable of storing the data corresponding to its (macro-)pixel, to communicate with its close neighbours and may make calculations on its data.

For multiple vision tasks, such architecture is sufficient to carry out the majority of the calculation work whilst only circulating the data on small capacitors (electrically speaking) in an integrated circuit (the energy dissipated proportional to these capacitors), thus representing several dozen femtofarads ($10^{-14}$ F). Compared to a normal vision system, the gain in energy with such architecture is around a factor of 100.

Based on this architecture of the bidimensional array of PEs, we have also sought to minimise the energy losses to communicate with the exterior of this array. Consequently, to send images to the PE array, it has been proposed to move it closer to that of the image matrix sensor (capacitors connected to the connections).

As proposed in JP-A-10 145 680 then US-A-6 608 296 (Toyada and Ishikawa), an image matrix sensor and PE array may be placed side by side, by sandwiching the analogue-digital conversion means between the two. It is also possible to superpose the image matrix sensor and a PE array, as previously proposed in FR-A-2 583 602 (Devos, Garda and Zavidovique), which is equivalent to installing each PE as close as possible to the photo-sensitive element of its corresponding pixel.

The system thus obtained is called an artificial retina, of which each pixel has a photo-sensitive element, a PE and, to connect them, an analogue-digital conversion device which may be limited to a voltage comparator.

To improve these devices further, in terms of their compactness, and to minimise the energy used, whilst still satisfying the other constraints of the system, which is to say a system capable of storing binary data, and exchanging it with its neighbours on the array, and carrying out universal Boolean calculations (processor), efforts have been especially made on the manner in which the information bits are stored in the PE.

Solutions have already been proposed to this problem.

A first storage mode that was used is the semi-static mode: each information bit is stored by means of two inverters that are re-looped via switches, forming a bistable system (two stable equilibrium states). Different set-ups have been proposed especially in FR-A-2 583 602 (Devos, Garda and Zavidovique), FR-A-2 683 348 (Zavidovique, Bernard and Devos) and FR-A2 7771 38 (Paillet, Mercier and Bernard). However such semi-static storage requires transistors of different types to be combined, which leads to set-ups that are not very compact in spite of all the efforts. This is a handicap when equipping a PE with a large capacity memory, for example of several dozen bits.

A storage mode that involves a more compact architecture than the semi-static mode is the dynamic mode, where a datum is stored in the form of a voltage at the terminals of a capacitor. Indeed, its compactness is related to the fact that the transistors used to store a bit are fewer and in particular of a same type. Stored dynamically, a 0 logic (respectively a 1 logic) will be represented by a voltage close to a certain value V0 (respectively V1). To determine which binary datum figures on a capacitor, a reading circuit is used which, basically determines if the voltage at the terminals of said capacitor is closer to V0 or to V1. The information stored on a capacitor may also be viewed as a load. A well known drawback of dynamic storage is the need to refresh the data by reading then rewriting, due to the parasite leak currents which progressively discharge the capacitors.

The recourse to dynamic storage in a PE of an artificial retina was initially proposed in JP-A-7 028 988 (Ishikawa and Yamada) and used again especially in JP-A-8 212 073 (Takayanagi, Yamada, Nakagami and Ishikawa). The set-ups proposed are based on storage based on latch circuit dynamics, also known as 3 transistor memory cells. These memory cells incorporate their own reading circuit. The advantage is that their reading is non-destructive (the datum may be read several times without being rewritten). The disadvantage is that this cell requires a separate reading bus and a writing bus (shared between the different memory cells) and two individual control signals. This is detrimental to the compactness of the PE (routing the signals).

Another use of dynamic storage in a PE of a retina is described in P. Dudek and P. J. Hicks. "A General Purpose Processor-per-Pixel Analog SIMD Vision Chip". IEEE Transactions on Circuits and Systems-I: Fundamental Theory and Applications, 52(1):13-20, January 2005. According to this document, it is used as a current memory cell. However the aim is to store an analogue datum, and several transistors and individual control signals are required for this memory cell.

Yet another use of dynamic storage in a PE repeated according to an array is presented in J. C. Gealow and C. G. Sodini. "A Pixel-Parallel Image Processor Using Logic Pitch-Matched to Dynamic Memory". IEEE Journal of Solid-State Circuits, 34(6):831-839, June 1999. In this work, carried out in the MIT, a binary datum is stored in a transistor memory cell, alias dRAM cell, simply formed by a capacitor connected to a reading/writing bus via a transistor controlled by a control signal. This dRAM cell is extremely compact, however its reading is destructive.

One aim of the invention is to propose a processing circuit, based on a PE repeated according to an array in an integrated circuit, capable of storing binary data, and exchanging it with its neighbours on the array, and of making universal Boolean calculations on them, using a common external control, of minimum size, whilst still offering a universal PE, which is to say one that is capable of carrying out any Boolean calculation, and thus any digital calculation, with reasonable efficiency.

For this purpose, a first aspect of the invention proposes a data processing circuit, characterised in that it comprises in combination:

a data processing unit comprising two signal conversion circuits which each have a signal input and a signal output, and a series of controlled switches connected to the inputs and outputs of said conversion circuits, wherein said data processing unit further comprises a binary signal input and a binary signal output, a memory unit comprising a series of capacitors connected to a memory bus arrangement via another series of switches that are each capable of storing a binary datum, wherein the bus is connected to the processing unit;

a set of inputs for the control signals of the controlled switches, wherein the data processing unit is able to carry out at least the following operations in response to given sequences of control signals:

writing in a capacitor a binary datum applied to the input, reading in a capacitor a binary datum that is stored therein, and applying it to the output, and combining logically the binary data stored in at least two capacitors.

Certain preferred but non-restrictive aspects of this circuit are as follows:

the conversion circuits are inverters with inverted sigmoid type responses.

a first inverter has its input and output connected to the memory bus arrangement each via a respective controlled switch.

the processing unit only comprises two inverters with the input of one connected to the output of the other via a first controlled switch and the input of the other connected to the output of the first one via a second controlled switch.

the circuit comprises an input for a compensation voltage that is connected via a capacitor to the input of the first inverter.

the circuit comprises an input for a compensation voltage that is connected via a capacitor to the memory bus arrangement.

the compensation voltage is variable.

at least the first inverter is formed by a comparator of which a positive input receives a threshold voltage.

the threshold voltage is variable.

the comparator or each comparator is formed using an operational transconductance amplifier.

the circuit is able to combine logically, on a first conversion circuit, the binary data stored in the capacitors in response to control signals that render conductive controlled switches of the memory unit to connect electrically said capacitors to the memory bus arrangement.

the type of logic combination varies in function of the value of the compensation voltage.

the type of logic combination varies in function of the value of the threshold voltage.

the capacitors are laid out in line, with a single memory bus and a single switch associated to each capacitor.

the capacitors are laid out in a matrix, with two bus line assemblies intersecting and a pair of controlled switches associated to each capacitor.

the pair of switches comprises a first switch of which the two signal terminals are connected between the capacitor and the bus, and a second switch of which two signal terminals are connected between a first control line and the control input of the first switch, and of which the control input is connected to a second control line.

the memory bus arrangement is created by segmenting the bus into several parts separated by respective controlled switches.

According to a second aspect of the invention, a data processing assembly is proposed, characterised in that it comprises an array of processing circuits each defined as above, and a control device that is able to apply to said control signal inputs control signals that are common to all of the processing circuits.

Certain preferred but non-restrictive aspects of this processing set up are as follows:

- each data processing unit is able to transfer binary data to a neighbouring processing unit via a controlled switch.
- each data processing unit is able to transfer binary data to neighbouring processing units and to receive from them binary data via a set of ports connected to a set of capacitors of its associated memory unit.
- the set of ports connects the processing unit to four neighbouring processing units positioned at the four cardinal points, wherein the ports of the neighbouring units are connected to each other two by two.
- the set of ports connects the processing unit to eight units neighbouring processing units positioned at the four cardinal points and to the secondary cardinal points, wherein the ports of the neighbouring units are connected to each other four by four.

Finally, in a third aspect, a matrix sensor is proposed, characterised in that it comprises a set of detection cells forming data sources, and a processing set-up as defined above.

Certain preferred but non-restrictive aspects of this sensor are as follows:

- it comprises in association with each cell a conversion circuit providing for each measurement a succession of binary values representative of the quantity measured.
- the cells are photo-sensitive cells.

Figure 2:
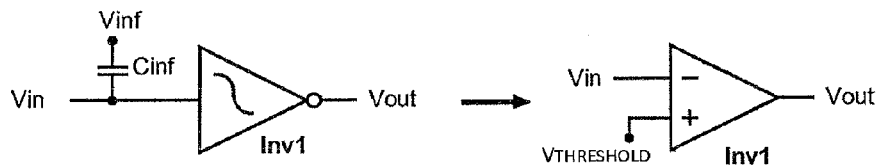
Figure 3:
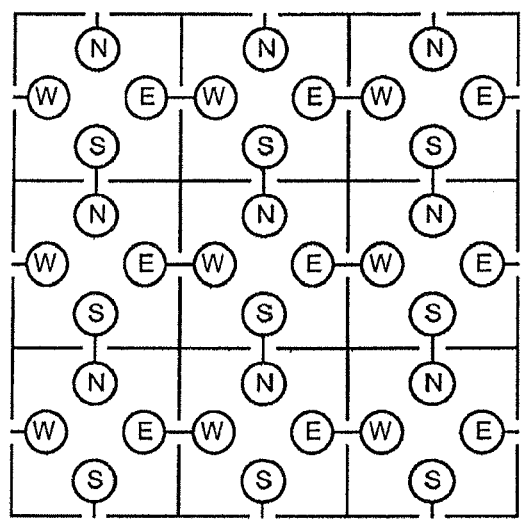
Figure 4:
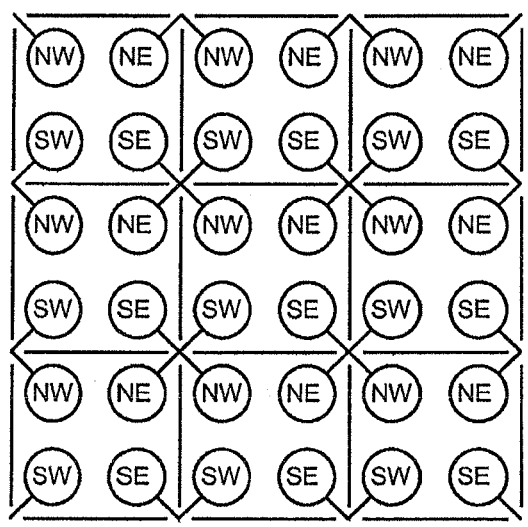
Figure 5:
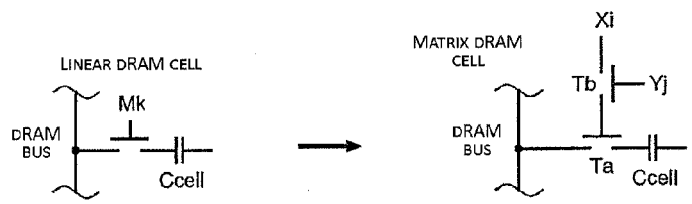
Figure 6:
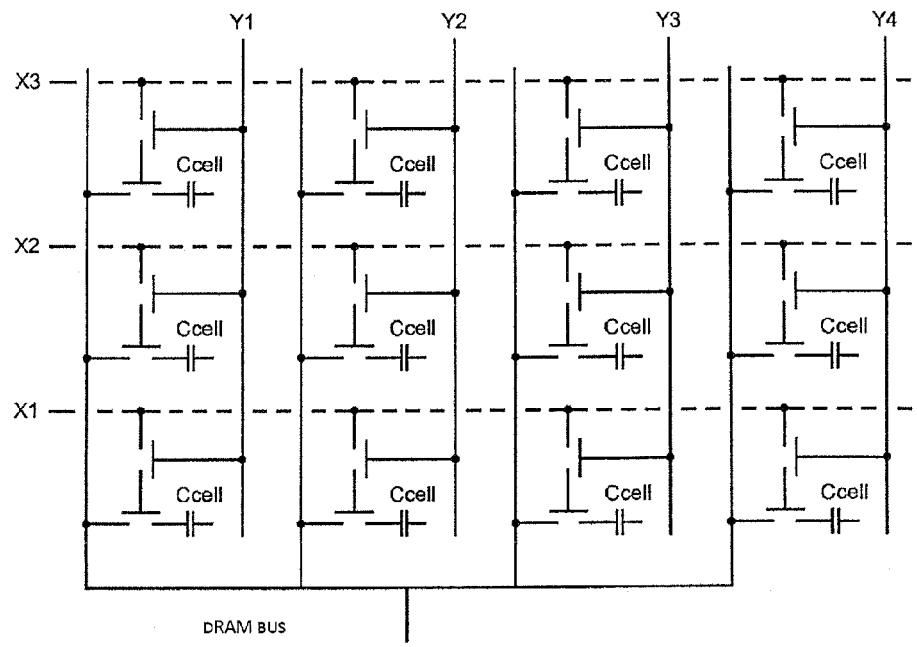
Figure 7:
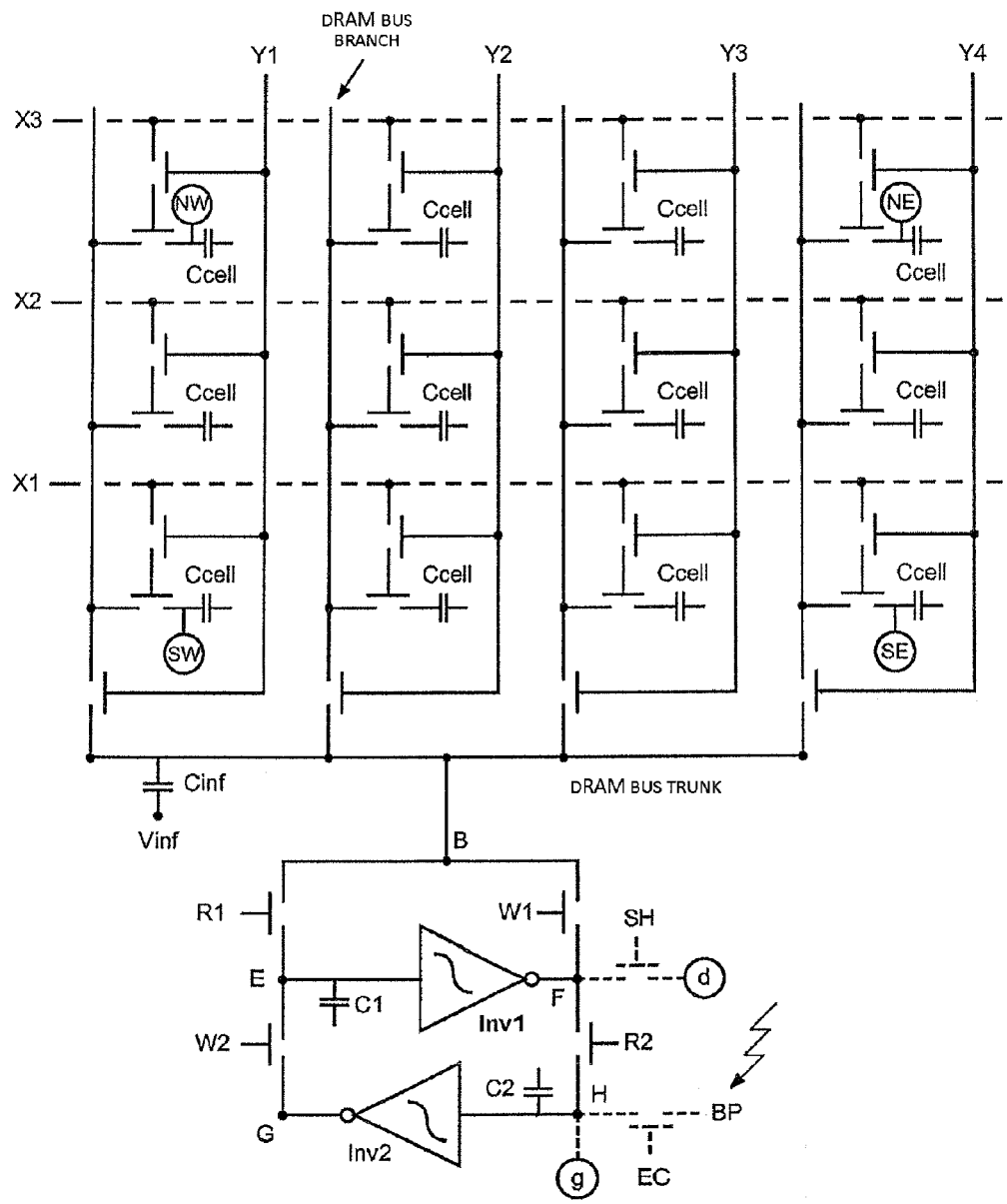

Other characteristics, aims and advantages of the invention will become clearer upon reading the following detailed description, and with respect to the appended drawings, provided by way of non-restrictive examples and in which:

FIG. 1 shows the general architecture of an elementary processor according to one embodiment of the invention, FIG. 2 shows two possible forms of conversion circuit used in an elementary processor of the invention, FIG. 3 shows interconnections authorising communication between an elementary processor and its 4 closest neighbours, FIG. 4 shows interconnections authorising communication between an elementary processor and its 8 closest neighbours, FIG. 5 shows two possible set-ups for the memory unit according to whether it has a linear (on the left) or a matrix structure (on the right), FIG. 6 shows a first embodiment of a dRAM with a matrix structure, and FIG. 7 shows an elementary processor equipped with a dRAM with a matrix structure improved by segmentation of the dRAM bus.

Now an elementary processor (PE) according to the invention will be described, of which the general architecture is presented in FIG. 1.

Its component elements are inverters, in this case there are two of them references Inv1 and Inv2 and which form the two conversion circuits, capacitors Ccell, C1, C2 and Cinf, and switches Mi, R1, W1, R2, W2, interconnected to one another. There is also a intrinsic parasite capacitor reference Cbus.

These are operators and each one may be formed in different ways. The inverters, of which the voltage-voltage characteristic is of the inverted sigmoid type as is reminded on their symbol as well as in the bottom left corner of FIG. 1, may be CMOS inverters or operational amplifier type set-ups mounted as comparators, especially operational transconductance amplifiers. The switches, for compactness, are advantageously made using transistors of a single type N or P (in opposition to their usual form of two complementary transistors in parallel), and in this case have the property of not transmitting correctly all voltages, and injecting loads into the circuit when opening-closing.

They will nevertheless be considered as ideal in a large part of this description, in order to avoid complicating matters.

By convention, a switch is conductive if its logic control signal is at 1: said signal is thus said to be activated. The control signals which appear in FIG. 1 are common to a series of elementary processors.

Among the capacitors shown, certain are native capacitors such as Cbus, C1 and C2, whereas others are voluntarily fitted such as Cinf, whose role will be described below, or the Ccell capacitors for storing values. The latter, which will be called "dRAM capacitors" hereunder (dynamic RAM), may be of the diode, MOS, and also inter-layer (metal, poly) types according to the technology used.

In FIG. 1, all of the capacitors, except for Cinf, are represented for reasons of simplification with a terminal not connected: in practice, this terminal is connected to the earth, to the supply voltage, or to another fixed voltage.

The same as the switches, the capacitors are considered as ideal in a large part of this description, which is to say linear.

FIG. 1 also shows communication ports, in the form of circled letters (d, g, S, N) whose role will be described below.

The general architecture of the elementary processor (PE) is structured into two units: at the top of FIG. 1 a memory unit (dRAM), and at the bottom of this same figure a data processing unit (Boolean unit or UB), the dRAM is formed by an assembly of p storage capacitors, of a Ccell capacitor, of which one of the terminals is connected to the fixed voltage mentioned above (on the RH side) and the other to a switch, called the access switch, reference Mi (where i is an index ranging from 1 to p), connecting to a common node called "dRAM bus". The association of a dRAM Ccell capacitor and its access switch Mi is called "dRAM cell". The i-th dRAM capacitor starting from the bottom is thus accessible from the dRAM bus by activating the Mi signal which controls the associated Mi switch (by convention, throughout this description the same reference sign is used to designate a controlled switch and the signal which controls this switch).

The dRAM bus has a Cbus natural electric capacitor, which is parasite in this case and thus to be minimised; however in practice, the Cbus value remains considerably higher than that of Ccell.

The Boolean unit (UB) is a reading/writing circuit of the dRAM. It has 5 nodes called B, E, F, G and H. Node B is connected to the dRAM bus.

Apart from its reading/writing function, the UB is capable of making Boolean calculations between several binary values, carried out in analogue, as will be described below.

The Boolean unit comprises four controlled switches R1, W1, R2 and W2, wherein the associated control signals are again designated in the same manner.

The different components of the Boolean unit, as mentioned above, are laid out as follows: the inverter Inv1 has its input connected to the node E and its output connected to the node F; the capacitor C1 is connected to the node E; the controlled switch R1 is fitted between the node E and the node B connected to the dRAM bus; the switch W1 is fitted between the nodes B and F; the switch W2 is fitted between the nodes E and G; the switch R2 is fitted between the nodes F and H; the inverter Inv2 has its input connected to the node H and its output connected to the node G; the capacitor C2 is connected to the node H; the capacitor Cinf is connected either to the node B, which is to say to the dRAM bus, or to the node E, which is to say to the input of the inverter Inv1; the node H may form an input of the elementary processor, whereas the node F may form its output.

In the Boolean unit, the native capacitors C1 and C2 play a role of dynamic memories and allow voltages to be conserved while the nodes E and H are left in high impedance.

The operation of the elementary processor of the invention is based on sequences of activation and deactivation of control signals, which close and open the different switches.

To describe these signals and their actions, a concise notation is adopted here. Which is to say X any control signal. "X" is used to note the activation of X (switching to 1, corresponding to the closure of a switch) and "X'" to its deactivation (switching to 0, corresponding to the opening of the switch). Different signals that are activated or deactivated simultaneously are joined by dotted lines, whereas a semi-colon separates the actions which must be successive. Consequently, for example, the sequence "R1-W1; W1'" designates the simultaneous activation of the R1 and W1 control signals, followed by the deactivation of W1. Furthermore, the notation "Reset" is used to designate the deactivation of all the control signals.

FIG. 1 simply shows the cooperation between the Boolean unit UB and dRAM in the processor. In practice, certain of the B, E, F, G and H nodes of the Boolean unit may receive other connections for other uses.

For example, if the elementary processor which is the subject of the invention is used in the pixel of a retina, typically a switch is added controlled by a EC signal to supply to the node H a binary signal BP from the photo-sensitive element, as is shown in dotted lines in FIG. 1. This signal BP may, classically, be the result of a comparison between the voltage of a photodiode and a variable external signal or, more generally, vehicle a succession of binary values representative of a physical value captured.

Whether this concerns a retina or not, another important function for an array of elementary processors is the input/output of sets of image or other data from/to the exterior. This function may be carried out by a single-direction offset register linking the Boolean units in each line of elementary processors in the array.

For this purpose, the node H is considered as a communication port g (for "gauche" in French, i.e. the left side) and the node F is connected to a communication port d (for "droite" in French, i.e. the right side) via a switch controlled by the signal SH, as shown in dotted lines in FIG. 1.

Furthermore, in the array of elementary processors (PE), the port d of all the PEs is connected to the port g of its right side neighbour. Thus, the sequence "SH; SH'; W2; W2'" offsets to the right by one PE the binary datum present on the node F (output of Inv1), and the other signals are deactivated. The effect of this is to translate to the right by one pixel the binary image supplied by the inverters Inv1 of all the PEs. By repeating the sequence, the various items of elementary data such as that of an image leave column by column on the right edge of the PE array.

Such a configuration also permits data to be introduced such as image data column by column on the left edge of the array.

The interaction between Boolean unit and dRAM, as part of the operation of the elementary processor of FIG. 1, will now be described in detail.

Preamble

Before describing the reading, writing and calculation sequences, we will examine the effect of the short sequence: "Reset; R1-W1; W1'"

This essential, analogue effect, will be at the centre of the reading and calculation operations presented below: all of the control signals are reset to 0, the activation of R1 and W1 places Inv1 in a closed loop, whilst connecting it to the dRAM bus. This switch to a closed loop of Inv1 takes its input Vin and Vout voltages to a same value Vbf that is both the X and Y axes of the point of intersection between the voltage-voltage characteristic of Inv1 and the first diagonal between the Vin and Vout axes.

This situation is represented graphically at the bottom left corner of FIG. 1: Vbf corresponds in practice to the steepest sloped zone of the voltage-voltage characteristic of Inv1. It is a zone that may correspond to high electrical currents, especially with CMOS inverters: a person skilled in the art will know how to limit them, either by reducing the difference between the power supply and earth voltages used by Inv1, or by the use of a set up limited in current.

At the end of the sequence, when W1 is deactivated (W1' command), the Inv1 operator switches to open loop but its input remains connected to the dRAM bus and the voltage remains equal to Vbf (a reminder is made that the injections of load by opening/closing of switches are neglected at this stage, with the observation made that they do not change the principle of operation). In these conditions, the output voltage Vout also remains at Vbf.

Based on this situation, any slight variation of the input voltage with respect to Vbf will cause a significantly greater variation on the output Vout. This property may be used to amplify a small variation of the voltage of the dRAM bus.

Reading

The following sequence, called reading, starts by that presented above in preamble and finally carries out the reading of the i-th dRAM capacitor:

"Reset; R1-W1; W1'; Mi; Mi'; R2; R2'; R1'"

This reading is destructive: when Mi is activated, the loads present on the i-th dRAM capacitor, of Ccell value and under a voltage Vcell, are mixed with those present on the dRAM bus and the input of Inv1, of capacity Ctot=Cbus+C1+Cinf (total reading capacity) and under the voltage Vbf. Let us consider $\Delta V = Vcell - Vbf$. Consequently the mixing of the loads causes on the dRAM bus a much lower variation in voltage $\Delta Vbus = [Ccell/(Ccell+Ctot)] \cdot \Delta V$.

In practice, Ccell is small compared to Ctot, and we can round off $\Delta Vbus \approx (Ccell/Ctot) \cdot \Delta V$. This small variation is all that remains of the datum read, and it is the amplification made by Inv1 which allows it to be restored.

For this purpose, the gain of Inv1, which is to say the slope of its voltage-voltage characteristic around Vbf, must be of the order of Ctot/Ccell, or greater.

Direct Writing

Once an item of data has been installed as the output of Inv2, it may be written as the j-th dRAM capacitor, by means of the following sequence:

"W2-R1-Mj; Mj'; R1'-W2'"

Complemented Writing

Whether the sequence above, called direct writing, has been executed or not, the complement of the datum read may be written on the k-th dRAM capacitor, thanks to the following sequence, called complemented writing sequence: "W2-W1-Mk; Mk'; W1'-W2'"

Multiple Writing

Whether this is in the reading sequence or the two writing sequences, the signal M (here and below, M designates one or several signals among M1 to Mp) which controls the access to the dRAM capacitor undergoes a window in that it is activated, then is deactivated in the next period. The same sequences may be used but by applying a window to several M signals simultaneously. With the writing instructions, this permits a multiple writing operation. For example, the following instruction writes the datum installed on the output of Inv2 onto the dRAM capacitors numbers i and j:

"W2-R1-Mi-Mj; Mi'-Mj'; R1'-W2'"

Multiple Reading and Boolean Calculation

If the same operation is carried out in a reading instruction, which is to say if several cells are read simultaneously, this makes a Boolean calculation. As will become clearer below, the most simple case to examine is that of a calculation on the 3 binary data Di, Dj and Dk contained in the dRAM capacitors numbers i, j and k (three separate indices between 1 and p), carried out using the following sequence:

"Reset; R1-W1; W1'; Mi-Mj-Mk; Mi'-Mj'-Mk'; R2; R2'; R1'"

This is a variant of the reading sequence presented above, where 3 capacitors are read instead of one (the only difference concerns the M signals) and it may be noted that it is also destructive. The result obtained is necessarily a function of Di, Dj and Dk, which will be identified below.

Earlier, V0 and V1 were used for the voltages corresponding respectively to 0 and 1 logics on the dRAM capacitors. With the writing instructions presented and ideal components, V0 and V1 are supposed to be the low and high output voltages of Inv2. However, in practice this is not the case where the switches are a single transistor.

In this perspective, let us simply suppose that V0 and V1 are symmetrically placed on either side of Vbf. We may then name $\Delta V = V1 - Vbf = Vbf - V0$. Furthermore, the fact that Ccell is small compared to Ctot permits approximations. Using calculations that it is not necessary to reproduce here, the connection of the bus to the 3 dRAM capacitors by activation of Mi, Mj and Mk causes a variation of its voltage (with respect to Vbf) close to:

$$(2\Sigma - 3) \cdot (Ccell/Ctot) \cdot \Delta V$$

where $\Sigma$ is the arithmetic sum of the 3 binary data Di, Dj and Dk.

In other terms, $\Sigma$ is the number of items of data at 1 among the 3. Therefore, if $\Sigma = 2$ or 3, the sequence above provides a 1 logic at the output of Inv2. However if $\Sigma = 0$ or 1, it provides a 0 logic. The calculation made is that of the well known Boolean function called "majority" (output retained in a complete binary adder): Maj(Di, Dj, Dk).

The implication of the sum $\Sigma$ above has a fundamental character because when loads from the different RAM capacitors are mixed, it is obvious that their arithmetic sum may still be estimated. The calculation above is therefore typical of what was previously known as threshold logic.

By eliminating Mk and Mk' from the previous sequence, the variant of the reading instruction is obtained which reads the 2 dRAM capacitors i and j. The variation in voltage obtained (with respect to Vbf) is thus:

$$\Delta Vbus \approx (2\Sigma - 2) \cdot (Ccell/Ctot) \cdot \Delta V$$

This variation is however nil if $\Sigma = 1$ (which is to say when Di≠Dj), leading to the appearance of an undetermined datum at the output of Inv2, of which the logic level is unclear.

To overcome this difficulty, a capacitive influence effect may be advantageously used, by providing an influence capacitor Cinf in the circuit, of which one terminal is connected either to the input of Inv1 (node E), as shown in FIG. 1, or to the dRAM bus (node B), as shown in FIG. 7. The voltage imposed on the other terminal of Cinf is the compensation voltage Vinf that is used as an analogue signal. By varying Vinf by a difference ΔVinf (increase or drop in voltage), a variation de voltage is caused on the dRAM bus and the input of Inv1 which, if large enough, finally permits a reliable binary value to be obtained at the output of Inv2.

Therefore the following new sequence is adopted, where ΔVinf designates the action itself of varying the compensation voltage Vinf by ΔVinf:

"Reset; R1-W1'; W1'; ΔVinf; Mi-Mj; Mi'-Mj'; R2; R2'; R1'"

The action ΔVinf forms in fact a command and it may be noted that it may occupy another position in the sequence, provided that it is between W1' and R2', and that it may possibly be executed simultaneously with another elementary action.

Other approaches may be envisaged to eliminate the ambiguity at the output of Inv2. In particular, the parasite capacitor of certain switches may be advantageously used to play "freely" the role of Cinf, and especially the capacitor of the R1, Mi or Mj switches. In this case, certain of these signals may undergo intermediate de voltage variations between their usual logic levels, variations which would functionally replace ΔVinf in the previous sequence.

In the embodiment in which an influence capacitor Cinf is installed, it is preferable to minimise the value, which requires that ΔVinf be maximised. However ΔVinf must remain adjustable faced with the technological uncertainties, and thus remain sufficiently lower than the difference in voltage between the power supply and the earth.

OR Logic

By adjusting the value of Cinf so that ΔVinf produces by itself a variation in the voltage of the dRAM bus close to (Ccell/Ctot)·ΔV, we obtain:

$$\Delta Vbus \approx (2\Sigma - 1) \cdot (Ccell/Ctot) \cdot \Delta V$$

which creates a Boolean function of OR logic between the Di and Dj data. The suggested choice for Cinf guarantees in fact the largest operating margins possible faced with the technological uncertainties and operating conditions.

AND logic

Furthermore, if the sign of ΔVinf is inverted with respect to the case of the OR logic (Vinf varies therefore in the opposite manner), then this gives:

$$\Delta Vbus \approx (2\Sigma - 3) \cdot (Ccell/Ctot) \cdot \Delta V$$

which creates Boolean function of AND logic between Di and Dj.

It may thus be understood that the arrangement of the Boolean unit of the invention in cooperation with the dRAM permits the creation, without the use of additional components, in addition to the reading and writing functions mentioned above, the OR and AND Boolean logic functions with two inputs, according to one important aspect of the invention.

Furthermore, thanks to the availability also described above of the complementation function by complemented writing, finally a universal elementary processor is created in terms of Boolean calculation.

It should be noted that, given the destructive nature of the reading and calculation sequences, writing operations will be used, whether multiple or not, complemented or not, to refresh or even duplicate in the dRAM any data that must be read, or that needs to be used for a calculation, one or several times, in the future.

OR Logic with 3 Inputs

By combining the reading of 3 dRAM capacitors and the capacitive influence described above, the following sequence may be implemented:

"Reset; R1-W1; W1'; ΔVinf; Mi-Mj-Mk; Mi'-Mj'-Mk'; R2; R2'; R1'"

We saw above that this sequence calculates the majority function if ΔVinf=0 (which is to say if the compensation voltage Vinf does not vary).

However if Cinf and ΔVinf were set to offset Vbus by 2·(Ccell/Ctot)·ΔV on their own, which is to say twice as much as above, then this would give:

$$\Delta Vbus \approx (2\Sigma-1) \cdot (Ccell/Ctot) \cdot \Delta V$$

Which creates the OR logic between the 3 data Di, Dj and Dk.

AND Logic with 3 Inputs

Furthermore, by adopting the opposite value for ΔVinf, we would obtain ΔVbus≈(2Σ−5)·(Ccell/Ctot)·ΔV, which corresponds to the AND logic between the 3 data.

The capacitive influence on the input of Inv1 or on the dRAM bus thus permits different types of calculations to be made on three binary data, by simultaneous reading of their corresponding dRAM capacitor. These are however optional functions given the universal nature already acquired by the PE proposed. They may be useful but they gave a cost: doubling the value of the Cinf. By extension of the process, it is possible to carry out calculations on more than 3 binary data, by further increasing the value of Cinf, if a person skilled in the art considered this relevant, taking into account the other constraints (in another variant presented below, the capacitive extra cost to carry out calculations on more than 2 binary data would disappear as the influence capacitor would no longer be used).

Logic Constants

Another advantage of the capacitive influence is to be able to create logic constants ex nihilo within the Boolean unit, by using the following sequence:

"Reset; R1-W1; W1'; ΔVinf; R2; R2'; R1'"

Depending on whether ΔVinf is (sufficiently) positive or negative, a 1 or a 0 logic is obtained at the output of Inv2.

In all of the sequences that have been presented, it should be noted that the simultaneous activations or deactivations may as a variant be made sequential with any order, for example to avoid des inrush currents or excessive capacitive effects. Furthermore, not all of the control signals need to be deactivated at the end of the sequence, depending on how these sequences are concatenated, which may be viewed as that many instructions. The sequences presented are thus simply a basis and may change according to the optimisation criteria retained.

An important variant of the capacitive influence on the input of Inv1 or on the dRAM bus, which allows the same set of functions to be obtained without using an influence capacitor, consists in laterally varying the voltage-voltage characteristic of Inv1. More precisely, this involves offsetting the steepest sloped part, towards the right or towards the left. To achieve this, a simple solution consists of using for Inv1 instead of a standard CMOS inverter a comparator between the usual input of Inv1 and a threshold voltage Vthreshold, applied to the positive input to conserve the inverter nature at Inv1, as shown on the right side of FIG. 2.

With such a layout, the voltage-voltage characteristic has its portion almost vertical for Vin=Vthreshold. Therefore Vbf=Vthreshold. It is thus possible to adjust Vbf directly, for example to position its value exactly between V0 and V1, as was supposed above. Alternatively, it is also possible to vary Vthreshold during a sequence, as was done above with Vinf, and it is sufficient to do so in lower proportions as the action of ΔVthreshold with respect to the voltage of the bus is henceforth direct whereas that of ΔVinf was weakened by the Cinf/Ctot factor. Accessorily, this higher efficiency of ΔVthreshold with respect to ΔVinf facilitates the calculations on three binary data or more, as presented above.

The comparator may be made using an OTA (operational transconductance amplifier). An OTA is bigger than a CMOS inverter, but it is naturally limited in current, which satisfies one of the concerns mentioned above. It may be advantageous to use the same layout for Inv2.

Until now, the switches and capacitors were supposed to be ideal. We will now explain how the elementary processor is able to function in spite of actual conditions that are not ideal such as: non-linearity of the capacitors, injection of loads during the opening/closing of switches or voltages cropped by the switches.

With linear capacitors, the voltage of the dRAM bus after connection to the dRAM capacitors is a refined function of Σ, as we have seen. In other terms the reading of m dRAM capacitors obliges the voltage of the dRAM bus to occupy m+1 possible levels, equidistant from one another. If Vbf coincides with one of these levels, there is an indetermination, this case is encountered for m=2.

To avoid this indetermination, either the input voltage of Inv1 is offset, by capacitive influence by adjusting Vinf, or the voltage-voltage characteristic of Inv1 is offset adjusting Vthreshold. In the description above, for m=2 then m=3, the values of ΔVinf have precisely been chosen to be situated halfway between 2 successive levels among the m+1, wherein this approach provides the largest operating margins faced with the technological and operating uncertainties. With non-linear capacitors, the m+1 levels will be slightly moved, and will not remain equidistant. For optimal operation, the different offsets simply need to be re-adjusted by the same amount as the voltage of the dRAM bus, connected to the input of Inv1, or to the voltage-voltage characteristic of Inv1.

The second perturbation with respect to the ideal conditions is the injection of loads by the switches. These injections of course cause voltage offsets. An opposite offset simply needs to be exerted to cancel them out, which is possible as above by readjusting by the same amount the offset that the voltage of the dRAM bus would normally have undergone, which is connected to the input of Inv1, or to the characteristic voltage-voltage of Inv1. The load injections however play a small random part: it is to make its effect negligible that the M signals are activated then deactivated immediately in the reading sequences presented above.

The third perturbation relates to the cropped voltages. Indeed, the switches are preferably made with a single transistor, thus of a single type (n or p) in CMOS technology. Whereas, the highest voltages do not pass via a n transistor, and the lowest voltages do not pass via a p transistor: the voltages are thus cropped, at the top or at the bottom.

In these conditions, V0 and V1, where the voltages which represent 0 or 1 logic in dRAM will be offset downwards or upwards in the range of voltages available. It may be noted that the dRAM matrix structure, which will be described below, according to another aspect of the invention, will strengthen this effect: it is possible for example to have V0=0V and V1=0.5V whereas the circuit operates with a supply voltage of 3.3 V.

In practice, it will be difficult or even impossible to bring Vbf to the median value of the V0 and V1 voltages thus offset. In such conditions, greater voltage offsets need to be made. If the capacitive influence is chosen, this requires a higher value of Cinf. If a comparator layout is chosen for Inv1 with Vthreshold on the positive input, this requires the Vthreshold to be varied during the reading instructions, as described above.

Another consequence of V0 and V1 being closer together is higher demands made on the gain of Inv1.

Finally, it would appear that the work of the circuit in actual conditions with interference with respect to the ideal conditions may be compensated by voltage offset on the dRAM bus connected to the input of Inv1 or by offset of the voltage-voltage characteristic of Inv1. An increase in the gain of Inv1 may also be required. Moreover, small random interferences may be minimised, and thus remain of no consequence, by the choice of a suitable order in the sequences.

The sequences presented above show that the Boolean unit UB may read and write data in the dRAM, and thus refresh data, and even create data ex nihilo. These sequences also show that fundamental Boolean operators are available, which is to say complement, AND logic and OR logic.

Finally, in spite of its very simple structure, which is compact and very economic, the elementary processor according to this aspect of the invention has a universal character as defined by Turing, which allows it to carry out any Boolean or digital calculations. It is also capable of carrying out less trivial calculations with a certain efficiency, such as that of the majority function, especially useful for digital additions in bit-series mode.

The communication between elementary processors (PE) is another important function of the invention.

In the following description, for the communication of a PE with its 4 closest neighbours, the NEWS network will be used, standing for North, East, West and South.

It was explained above how to unite the Boolean units of the PEs of a same line with a single direction offset register for example towards the right in the circuit of FIG. 1, which is to say in the East direction. It is possible to proceed in this manner for each of the 4 cardinal directions. In total this adds 4 switches to a Boolean unit, each accompanied by its control signal that must be connected to the nodes E, F, G or H, between 2 neighbouring elementary processors.

An alternative to the offset register chaining consists of sharing a storage capacitor between the dRAM of any pair of neighbouring PEs. To explain and illustrate this approach, described in reference to FIG. 3, the notion of communication ports will be used: each PE is considered as being equipped with 4 communication ports: N, E, W, and S. Each port is connected internally and externally to the PE, identically for each PE. Internally, each port is connected to a dRAM capacitor, as shown in FIG. 1 for the N and S ports only. Externally to the PE, the ports are connected to one another from one neighbouring PE to another neighbouring PE, according to the organisation of FIG. 3: this shows a 3×3 PE matrix, where each PE is defined by a square inside which only the communication ports are shown.

With this organisation, the data transfer between neighbouring PEs is achieved by a simple writing-reading operation on a certain capacitor of the dRAM memory. For example, where the positions of the N and S ports are those shown in FIG. 1, the offset of data towards the North simply consists of writing this data from the Boolean unit to the dRAM capacitor with index p, then reading the dRAM capacitor of index 1. In other terms, a single offset towards the North consists of writing on the N port, then reading the S port. Reciprocally, a single offset towards the South consists of writing on the S port, then reading the N port. By proceeding in a similar fashion with the E and W ports, each PE may thus communicate with its 4 closest neighbours on the array.

By mobilising four dRAM capacitors and their associated access signals, this shared memory based solution may appear as costly in terms of size as that as the offset register based solution. However it is more economic with the matrix structure dRAM as will be described below.

One variant of the shared memory solution is proposed in FIG. 4, in which each PE still has 4 ports, each connected to a different dRAM capacitor, but named as each of the secondary cardinal points, respectively NW, NE, SE and SW. This variant allows each PE to communicate with bits 8 closest neighbours, for an insignificant extra cost. For example for an offset towards the South-East, we write on the SE local port, then read on the NW port of the neighbour located in the south-west. For offset towards the South, then we may write on the local SE port then read on the NE port of the destination, or even write on the local SW port then read on the NW port of the destination.

It is this variant which appears on the improved dRAM matrix structure of FIG. 7, as will be described below.

It has been shown above that the elementary processor (PE) of the invention has a universal character. Furthermore, the communication techniques between PEs which have just been presented guarantee that binary data may be translated according to any vector by repeating elementary translations in NEWS directions.

However, the total translation time increases with the size of the vector and may cause edge effects. Finally, each PE may access data around it, but in a neighbouring area whose size is limited by the edge effects that are considered acceptable: it is said that the processing operations have a defined support.

Given that the PE array or matrix is piloted in SIMD mode (Single Instruction, Multiple Data), each PE accesses the same neighbours in its relative reference. This results in an invariable translation. In mathematical terms, the processing operations that may be carried out on the PE array piloted in SIMD mode are commutative with respect to the translations: in other terms, carrying out a translation before or after processing provides the same result.

These two properties (defined support and invariable translation) characterise the low level image processing in its widest sense. Included are of course the convolution core based linear filtering operators. However, with an elementary processor operating at Boolean level, it is often more appropriate to use operators whose non-linearity is more pronounced, such as digit place filters or mathematic morphology operators.

We will now describe in reference to FIGS. 5 to 7 an embodiment of the invention with a matrix arrangement of the capacitors forming the dRAM.

Firstly, the PE as shown in FIG. 1, has been designed to occupy the minimum amount of space in an integrated circuit, whilst maintaining a universal character. However the dRAM is organised linearly: for n dRAM capacitors, n Mi control signals are required.

Where n is greater than a certain value (typically 10), it is the routing of the Mi control signals which becomes preponderant when considering the actual size of the circuit. To avoid this situation, one solution is to organise the dRAM in a matrix, as shown in FIGS. 6 and 7: instead of being controlled by a single Mk signal, each dRAM cell will be subject to the joint activation of a signal $X_i$ and another signal $Y_j$ according to a line/column type command. There is consequently a family of $X_i$ signals and a family of $Y_j$ signals. Within a same family, the signals will be routed in parallel. In return, the two families will be routed perpendicularly to one another in the dRAM, which gives rise to the matrix structure shown in FIG. 6 and in FIG. 7, where there is a dRAM cell for each pair formed by a signal $X_i$ and a signal $Y_j$.

A dRAM matrix structure requires two switches in each dRAM cell. However, it is not easy to replace the access switch associated to each dRAM capacitor in the linear structure by two switches in series to obtain the matrix version, due to the substantial parasite capacity that would be created between the two switches and which could interfere with the operation.

The approach proposed here is to cascade two switches Ta and Tb as shown on the right side of FIG. 5 (of which the left side shows the cell of a linear dRAM, like that of FIG. 1), which shows a dRAM cell attached to a section of the dRAM bus. It may be seen in this figure that the switch Ta selectively connects the Ccell capacitor to the dRAM bus, commanded to do so by the signal Xi as it is transmitted by the switch Tb itself commanded by the signal Yj.

Given that each switch is created using a single transistor (and therefore of a single type), the voltages written on the dRAM capacitor will again be even more cropped than in the case of a linear dRAM. This situation has been covered and resolved above.

To connect to the dRAM bus the dRAM cell commanded jointly by the Xi and Yj signals, then to disconnect it, the windows need to be interleaved on Xi and Yj, using the following instruction sequence:

"Yj; Xi; Xi'; Yj'"

The dRAM matrix structure is shown in FIG. 6 by an example with 12 cells where the set of the Xi is {X1, X2, X3} and where the set of the Yj is {Y1, Y2, Y3, Y4}. The Yj are brought vertically in the figure, whereas the Xi are brought horizontally in the figure according to the dotted lines. The dRAM bus preferably has a comb structure such as that shown which is the least costly to implant.

It is interesting to make a quantitative comparison of the dRAM linear and matrix structures. For n dRAM capacitors, the linear structure requires n switches (which is to say n transistors) and n control signals, whereas the matrix structure requires 2n switches (which is to say 2n transistors) and approximately 2$\sqrt{n}$ control signals. The matrix organisation is more advantageous than the linear organisation as from when n significantly exceeds 10.

Another possible matrix structure for the dRAM is shown in FIG. 7. It is identical to that of FIG. 6, except for in the arrangement of the dRAM bus of which the comb structure is hierarchised: the "teeth" of the comb, in this case called "branches of the dRAM bus" are separated by switches of the "back of the comb", in this case called "trunk of the dRAM bus". These additional switches are respectively controlled by the Yj signal which controls the dRAM cells of the same column.

This improved dRAM structure is advantageous in terms of the capacity of the dRAM bus. Indeed, to read one or several or cells located in the same column, only the corresponding branch of the bus is connected to its trunk. Consequently, the Ctot capacity used in the previous formulae is reduced as the Cbus capacity is limited to the capacity of the trunk and to that of a single branch of the bus.

The gain required at Inv1, which must be of the order of Ctot/Cell, is also reduced, thus facilitating the creation of Inv1 or permitting the increase in the number of storage capacitors in the dRAM.

Whether for the matrix dRAM of FIG. 6 or for the matrix dRAM according to the variant of FIG. 7, the reading or writing sequences remain identical, except for the control signals of the dRAM.

Advantageously, the Yj signal(s) concerned are activated at the start of the sequence and it is/they are deactivated at the end of the sequence. The window of the Xi signal or signals concerned appears where the M signal of the linear dRAM instructions described above appears.

For example, below is shown the sequence permitting the simultaneous reading of the two cells Xi1Yj and Xi2Yj (where i1 and i2 are two indices), located on the same column j, which is to say connected to the same branch j of the dRAM bus:

"Reset; R1-W1-Yj; W1'; ΔVinf; Xi1-Xi2; Xi1'-Xi2'; R2; R2'; R1'-Yj'"

A reminder is made that this sequence permits the AND or the OR logic to be obtained between the two items of data read, according to the value of the offset ΔVinf.

There are many variants, which are even more numerous than with the linear dRAM. It is also possible to read two cells located on two different branches j1 and j2 of the bus, thus on two different columns of the dRAM, but on the same line i, by means of the following instruction:

"Reset; R1-W1-Yj1-Yj2; Wr; ΔVinf; Xi; Xi'; R2; R2'; R1'-Yj1'-Yj2'"

The switching of the X and Y signals always takes place at the same position. It is even possible to read the cells positioned at the intersection of several columns and several lines. However this is not essential to use the PE, even if a use may be found for it.

In fact, when actually using the elementary processor, it is preferable to organise the data in the dRAM so that the calculations concern memory cells located on the same branch of the bus, in order to minimise the electrical capacities used and to avoid the use of too many different adjustments for the voltage offset ΔVinf.

It may be noted that obtaining writing instructions on the matrix dRAM is achieved by simply adapting the instructions used with a linear dRAM, which a person skilled in the art may accomplish easily.

FIG. 7 shows the improved matrix dRAM connected to the same Boolean unit as that of FIG. 1, except for Cinf which has been moved from node E to node B, according to one possibility described above. In return, in the dRAM appear the communication ports NW, NE, SE and SW corresponding to the arrangement of FIG. 4, permitting the communication of each elementary processor with its 8 closest neighbours.

The invention may present interesting applications especially with matrix sensors, and more especially with image sensors artificial retinas etc., as well as any other type of sensor (pressure sensor, etc.).

In this case, an elementary processor is provided for a cell or for a limited group of cells of the sensor, with an arrangement which permits a suitable geographical proximity.

The interfacing of the Boolean unit of each elementary processor with its sensor(s) may be designed in different ways, within the scope of a person skilled in the art. For example, an analogue/digital conversion where the bits are supplied to the input of the Boolean unit in series is appropriate.

Of course, many variants and modifications may be made to the invention.

In particular, even though an important property of a processing unit of an elementary processor according to the invention is to be based on two conversion and signal formatting circuits, a person skilled in the art may observe that these two circuits may be completed by any secondary component that allows the operation to be enriched, improved, compensated or made more reliable.

The invention claimed is:

1. A data processing circuit, comprising:
a data processing unit comprising first and second signal conversion circuits, each having a signal input and a signal output, and a plurality of controlled switches connected to the inputs and outputs of the conversion circuits, wherein the data processing unit further comprises a binary signal input and a binary signal output, a memory unit comprising a plurality of capacitors connected to a memory bus arrangement via a plurality of switches, each capacitor storing a binary datum, wherein the bus is connected to the processing unit, a plurality of inputs for control signals of the controlled switches, wherein the data processing unit is capable of carrying out at least the following operations in response to control signal data sequences:

writing in a capacitor a binary datum applied to an input line, reading in a capacitor a binary datum that is stored therein, and applying the read binary datum to an output line, and logically combining binary data stored in at least two capacitors.

2. A circuit according to claim 1, wherein the conversion circuits are first and second inverters which have inverted sigmoid type responses.

3. A circuit according to claim 2, wherein a first inverter has an input and an output connected to the memory bus arrangement each via a corresponding controlled switch.

4. A circuit according to claim 3, wherein the input of the first inverter is connected to an output of the second inverter via a first controlled switch and an input of the second inverter is connected to the output of the first inverter via a second controlled switch.

5. A circuit according to claim 4, comprising an input for a compensation voltage that is connected via a capacitor to one of: the input of the first inverter and the memory bus arrangement.

6. A circuit according to claim 5, wherein the compensation voltage (Vinf) is variable.

7. A circuit according to claim 6, wherein at least the first inverter is a comparator comprising positive input that receives a threshold voltage.

8. A circuit according to claim 7, wherein the threshold voltage is variable.

9. A circuit according to claim 8, wherein the comparator is formed by an operational transconductance amplifier.

10. A circuit according to claim 9, which is capable of logically combining, in the first conversion circuit, the binary data stored in capacitors in response to control signals that cause the switches of the memory unit to electrically connect the capacitors to the bus memory arrangement.

11. A circuit according to claim 10, wherein a type of logic combination varies with a value of the compensation voltage.

12. A circuit according to claim 10, wherein a type of logic combination varies with a value of the threshold voltage.

13. A circuit according to any claim 1, wherein the capacitors are arranged in a line, a single memory bus and a single switch being associated with each capacitor.

14. A circuit according to claim 1, wherein the capacitors are arranged in a matrix, two sets of intersecting bus lines and a pair of controlled switches being associated with each capacitor.

15. A circuit according to claim 14, wherein the pair of controlled switches comprises a first switch and a second switch, wherein two signal terminals of the first switch are connected between the associated capacitor and the bus, and wherein two signal terminals of the second switch are connected between a first control line and a control input of the first switch, the control input being connected to a second control line.

16. A circuit according to claim 1, wherein the memory bus arrangement is formed by segmentation of the bus into several parts separated by respective controlled switches.

17. A data processing assembly, comprising an array of data processing circuits according to claim 1, and a control device that can apply to control signal inputs control signals that are common to all of the data processing circuits.

18. An assembly according to claim 14, wherein each data processing unit is capable of transferring binary data to a neighbouring processing unit via a corresponding controlled switch.

19. An assembly according to claim 17, wherein each data processing unit is able to transfer binary data to neighbouring processing units and to receive from the neighbouring processing units binary data via a set of ports connected to a set of capacitors in an associated memory unit.

20. An assembly according to claim 19, wherein the set of ports connects the processing unit to four neighbouring processing units positioned at four cardinal points, wherein the ports of the neighbouring units are connected to the processing unit two by two.

21. An assembly according to claim 19, wherein the set of ports connects the processing unit to eight neighbouring processing units positioned at four cardinal points and at secondary cardinal points, wherein the ports of the neighbouring units are connected to the processing unit four by four.

22. A matrix sensor comprising a set of detection cells forming data sources, and a processing assembly according to claim 17.

23. A matrix sensor according to claim 22, comprising a conversion circuit for measuring a succession of binary values representative of a quantity measured.

24. A matrix sensor according to claim 22, wherein the cells are photosensitive cells.

* * * * *